(12) United States Patent
Salcido et al.

(10) Patent No.: US 7,786,739 B2
(45) Date of Patent: Aug. 31, 2010

(54) IDENTIFICATION OF BOARD CONNECTIONS FOR DIFFERENTIAL RECEIVERS

(75) Inventors: Manuel Salcido, Fort Collins, CO (US); James Hansen, Loveland, CO (US); Greg Milburn, Fort Collins, CO (US)

(73) Assignee: Avago Technologies Fiber IP (Singapore) Pte. Ltd., Singapore (SG)

( * ) Notice: Subject to any disclaimer, the term of this patent is extended or adjusted under 35 U.S.C. 154(b) by 326 days.

(21) Appl. No.: 12/102,244

(22) Filed: Apr. 14, 2008

(65) Prior Publication Data

US 2009/0257481 A1 Oct. 15, 2009

(51) Int. Cl.
G01R 31/26 (2006.01)

(52) U.S. Cl. .................. 324/715; 714/724; 714/726

(58) Field of Classification Search .................. 324/715
See application file for complete search history.

(56) References Cited

U.S. PATENT DOCUMENTS

| | | | |
|---|---|---|---|
| 6,918,073 B2 * | 7/2005 | Linam et al. ............... | 714/724 |
| 7,043,674 B2 * | 5/2006 | Rearick et al. ............ | 714/724 |
| 7,305,601 B2 * | 12/2007 | Vu ............................. | 714/726 |
| 2003/0196150 A1 * | 10/2003 | Linam et al. ............... | 714/724 |
| 2004/0189339 A1 * | 9/2004 | Conner ...................... | 324/765 |
| 2005/0190828 A1 * | 9/2005 | Hsu et al. ................... | 375/224 |
| 2007/0126431 A1 * | 6/2007 | Blake ......................... | 324/647 |

* cited by examiner

*Primary Examiner*—Timothy J Dole
*Assistant Examiner*—Benjamin M Baldridge

(57) ABSTRACT

Embodiments of the invention include testing arrangements for detecting proper DC-coupled board connections on the input legs of a differential receiver. The testing implementation includes a first test receiver AC-coupled to the connection between the first input/output (I/O) pad and the differential receiver positive input and/or a second test receiver coupled to the connection between the second I/O pad and the differential receiver negative input. The test receiver protects the test receiver input from DC voltages applied to the differential receiver via the differential receiver input. Also, the test receiver includes a high-pass filter arrangement that generates data capable of detecting whether the I/O pad connected to the test receiver has a proper DC-coupled connection or an improper connection when presented with a stimulus pulse. The test receiver is less susceptible to noise because than conventional arrangements that use a low-pass RC filter.

11 Claims, 2 Drawing Sheets

IDENTIFICATION OF BOARD CONNECTIONS FOR DIFFERENTIAL RECEIVERS

BACKGROUND OF THE INVENTION

1. Field of the Invention

The invention relates to differential receivers. More particularly, the invention relates to testing arrangements and methods for verifying proper board connections of differential receivers.

2. Description of the Related Art

Differential receivers are devices configured to receive information transmitted according to a differential signaling method. Differential signaling, which typically is used in relatively high speed signaling, especially when transmitting information relatively significant distances, involves the transmission of two complementary signals over separate conductors. A differential receiver reads the two complementary signals received from a transmission source and provides an output based on the difference between the two complementary signals.

The IEEE 1149.6 Standard for Boundary Scan Testing of Advanced Digital Networks was created to be able to detect the single-ended connection path on a differential input/output (I/O) port or pad. The standard was developed to detect proper termination if an alternating current (AC)-coupled capacitor or a direct current (DC) connection is implemented. In general, one type of boundary scan testing makes use of a plurality of serially connected data storage devices, such as shift registers, and involves loading a value into a register and then applying a certain voltage condition to the associated I/O pad to determine if an open or short circuit exists.

The IEEE 1149.6 Standard calls for a test receiver that behaves as a comparator on a single leg of a differential pair. Conventionally, the test receiver includes a low-pass RC circuit coupled thereto that will time-delay a signal transition with respect to itself so that the test receiver can detect a high or low transition. However, the use of the low-pass RC circuit in the test receiver forces this conventional test implementation to have a custom RC filter and test receiver for each board application. Such need for custom test circuitry inhibits the use of a universal circuit for testing different types of differential I/O ports, i.e., for different board applications. Also, the low-pass RC filter in the conventional test receiver is susceptible to noise, and limits the operating frequency of the test receiver.

Therefore, a need exists for a more robust and simpler implementation and method for the detection of proper external (on-board) connections for differential receivers.

SUMMARY OF THE INVENTION

The testing arrangements and methods described herein involve detecting proper DC-coupled board connections on each leg of a differential receiver. The testing arrangements and methods are based generally on using a high-pass filter arrangement that serves a dual purpose as part of the protection circuitry for core-level field effect transistor (FET) components, as well as for providing a simpler yet more robust configuration for detecting proper external (on-board) connections of differential receivers. The testing arrangements and methods described herein are simpler to implement than conventional testing techniques, and parts of the inventive testing arrangements and methods can be relatively easily leveraged across multiple receiver pad types. Also, the testing arrangements and methods described herein are less susceptible to noise because, unlike conventional arrangements, the use of a low-pass RC filter is avoided. The testing implementation includes a first test receiver AC-coupled to the connection between the first input/output (I/O) pad and the positive input of the differential receiver and a second test receiver coupled to the connection between the second I/O pad and the negative input of the differential receiver. The test receiver is AC-coupled to the input/output pad in a manner that protects the corresponding input of the test receiver from DC voltages applied to the differential receiver via the input of the differential receiver. Also, the test receiver includes a high-pass filter arrangement that generates data capable of detecting whether the input/output pad connected to the test receiver has a proper DC-coupled connection or an improper connection when presented with a stimulus pulse.

DETAILED DESCRIPTION

Figure 1:
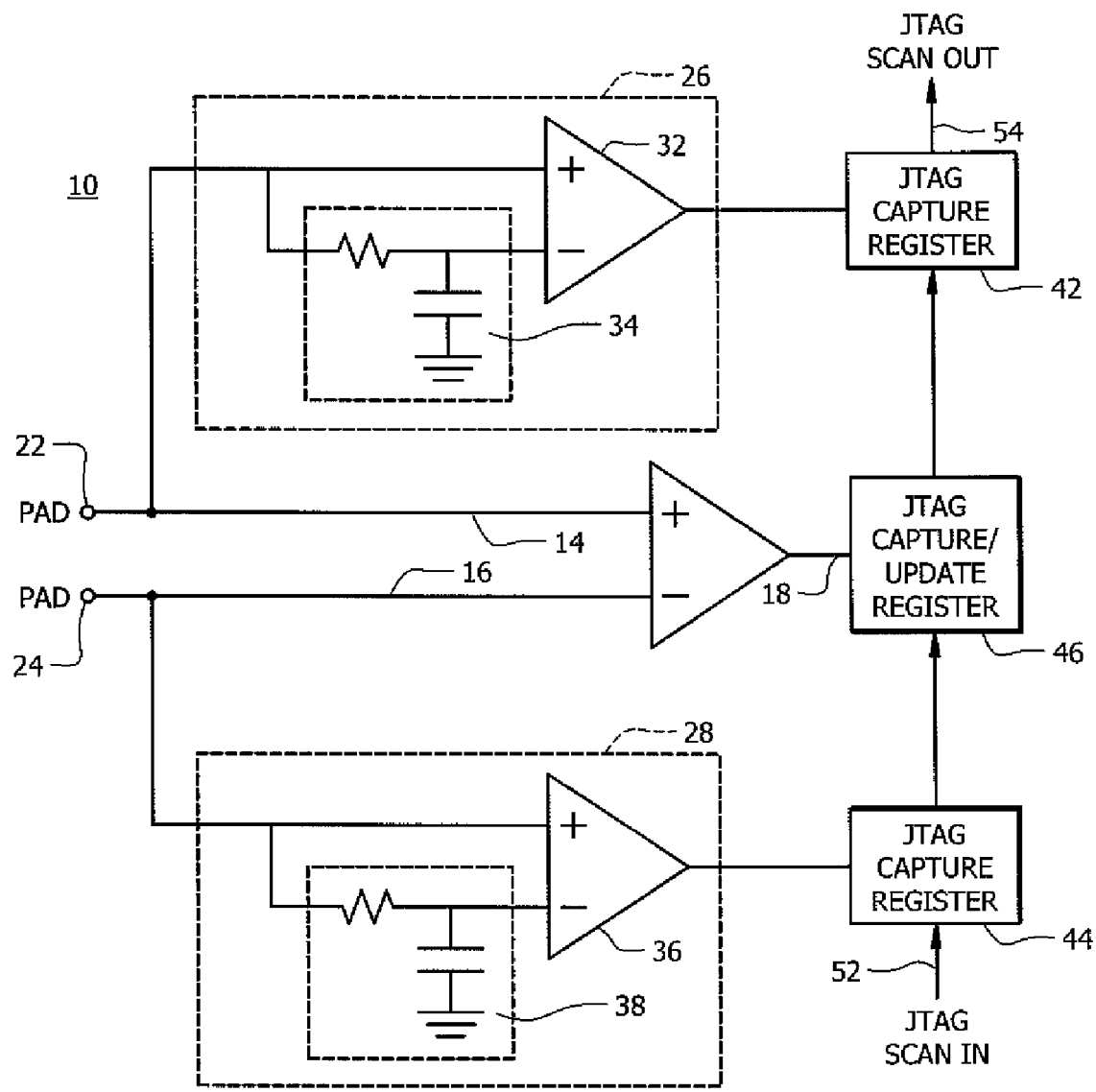
FIG. 1 is a schematic view of a differential receiver including conventional testing circuitry for detecting proper board connections to the differential receiver.

In the following description, like reference numerals indicate like components to enhance the understanding of the differential receiver testing methods and arrangements through the description of the drawings. Also, although specific features, configurations and arrangements are discussed hereinbelow, it should be understood that such specificity is for illustrative purposes only. A person skilled in the relevant art will recognize that other steps, configurations and arrangements are useful without departing from the spirit and scope of the invention.

Referring now to FIG. 1, shown is a schematic view of a portion of a differential input circuit 10, including conventional testing circuitry for detecting proper board connections to the differential receiver. The differential input circuit 10 includes a differential receiver 12 having a first positive input 14, a second negative input 16 and an output 18. The first input 14 typically is connected to a first input/output (I/O) pad 22, and the second input 16 typically is connected to a second I/O pad 24. The I/O pads 22, 24 are used to connect the differential input circuit 10 to other chips, such as a differential driver chip, via a circuit board and circuit board connections, e.g., conductive traces between the differential driver chip and the differential input circuit 10.

As discussed hereinabove, according to the IEEE 1149.6 Standard, conventional testing circuitry used to test for proper connectivity of external components to the differential receiver 12, e.g., via the I/O pads 22, 24, includes a test receiver, that behaves as a comparator, connected to each of the single legs of the differential pair, i.e., connected to each of the differential receiver inputs 14, 16. More specifically, the testing circuitry includes a first test receiver 26 connected between the first I/O pad 22 and the first input 14, and a second test receiver 28 connected between the second I/O pad 24 and the second input 16. Also, as discussed hereinabove, each test receiver includes a low-pass RC circuit that will time-delay a signal transition with respect to itself so that the test receiver can detect a high or low transition.

For example, the first test receiver 26 effectively includes a first comparator 32 connected between the first I/O pad 22 and the first input 14 of the differential receiver 12. A first input of the comparator 32 is connected directly to the first I/O pad 22, and a second input of the comparator 32 is connected to the first I/O pad 22 via a first RC circuit 34 configured as a low-pass RC filter. Also, the second test receiver 28 effectively includes a second comparator 36 connected between the second I/O pad 24 and the second input 16 of the differential receiver 12. A first input of the second comparator 36 is connected directly to the second I/O pad 24, and a second input of the second comparator 36 is connected to the second I/O pad 24 via a second RC circuit 38 configured as a low-pass RC filter.

The output of the first comparator 32 is connected to a first data storage device, such as a first JTAG capture register 42, which typically is part of a boundary scan circuit (BSC). The output of the second comparator 36 is connected to a second data storage device, such as a second JTAG capture register 44, which also typically is part of the boundary scan circuit. The designation JTAG refers to a boundary scan architecture proposed by the Joint Test Action Group for (JTAG) for test access ports used for testing printed circuit boards according to the IEEE 1149.1 standard. The output 18 of the differential receiver 12 can be connected to a third data storage device, such as a JTAG capture/update register 46, which also typically is part of the boundary scan circuit. As discussed, the data storage devices 42, 44, 46 form a portion of a boundary scan architecture around the differential receiver 12. As such, the second JTAG capture register 44 includes a JTAG scan input (JTAG SCAN IN) 52 and the first JTAG capture register 42 includes a JTAG scan output (JTAG SCAN OUT) 54. The JTAG capture/update register 46 is connected between the first and second JTAG capture registers 42, 44, e.g., as shown.

In operation, in general, the first test receiver 26 provides a comparison of the differential signal received on the first I/O pad 22 and captured by the first test receiver 26 with a delayed version of the captured differential signal to remove any effects of an unknown offset. The first test receiver 26 provides the resulting output to the first JTAG capture register 42. Similarly, the second test receiver 28 provides a comparison of the differential signal received on the second I/O pad 24 and captured by the second test receiver 28 with a delayed version of the captured differential signal, and provides the result to the second JTAG capture register 44.

The data provided to the first and second JTAG capture registers 42, 44 by the first and second test receivers 26, 28, respectively, are compared with predetermined values. If the data provided by the test receivers to the JTAG capture registers are as expected, i.e., the captured data matches the known test patterns of data, then proper connections to the differential input circuit 10 via the I/O pads 22, 24 are assumed to exist. However, if the data provided by the test receivers to the JTAG capture registers are different than the know test patterns, then it is assumed that the differential input circuit 10 is not properly connected via the I/O pads 22, 24.

As part of the testing for proper board connections to the differential receiver 12, the arrangement of the conventional testing circuitry shown in FIG. 1 was developed to test for capacitive shorts if an AC-coupled capacitor is supposed to be coupled to one of the I/O pads 22, 24. For example, AC-coupled capacitors sometimes are coupled to one or both of the I/O pads 22, 24 for protection of the differential input circuit 10 from other boards and components that are plugged into or connected to the differential input circuit 10 via the I/O pads 22, 24. The testing circuitry also tests for an open connection at the I/O pad if a DC connection is supposed to be made to the respective I/O pad.

However, the conventional testing circuitry arrangement shown in FIG. 1 has several disadvantages. For example, the use of a low-pass RC circuit in each of the first and second test receivers 26, 28 (e.g., RC circuits 34, 38) requires that the RC filter be custom-made for the particular circuit within which the differential receiver 12 is included. That is, the values of the resistor and capacitor in each RC filter must be such that the RC constant is tuned to or within a relatively narrow acceptable operating range to coincide with the operating frequency of the particular circuit within which the differential receiver 12 is included and its associated application. Therefore, the conventional testing circuitry arrangement shown in FIG. 1 is not suitable for operation as part of a universal circuit arrangement for testing different types of I/O ports of different types of differential receivers that may be included on various circuit chips for several different applications. Also, the low-pass RC circuit used in each of the first and second test receivers 26, 28 is susceptible to noise, and limits the operating frequency of its respective test receiver.

Also, in operation, each of the test receivers 26, 28 generally test simply for the absence or the presence of a voltage transition on their respective I/O pad 22, 24. For example, if no voltage transition is present on the I/O pad 22, the first input 14 of the differential receiver 12 would reflect such voltage absence, and the output 18 of the differential receiver 12 would provide an appropriate indication that an improper connection to the differential receiver 12 exists. If the I/O pad 22 has a proper connection thereto and a voltage transition therefore exists on the I/O pad 22, the test receiver 26 would provide an appropriate indication to the first input 14 of the differential receiver 12 so that the output 18 of the differential receiver 12 would indicate that a proper connection to the differential receiver 12 exists.

However, in some cases, an improper connection to the differential receiver 12, e.g., a disconnected grounding resistor, may actually cause a voltage to be present on the I/O pad 22, albeit an improper voltage, i.e., a voltage level that falls outside of any suitable voltage range for any possible applications of the differential input circuit 10. In such case, the test receiver 26 may still provide an indication to the first input 14 of the differential receiver 12 that the differential receiver 12 ultimately would interpret as a proper connection. Accordingly, the differential receiver 12 would indicate that a proper connection exists when in fact there is an improper board connection. This is because the conventional testing circuitry arrangement shown in FIG. 1 does not distinguish between improper voltage levels due to improper connections and proper voltage levels due to proper connections, but rather distinguishes between the absence of a voltage transition, usually due to an improper connection, and the presence of a voltage transition, which often, but not always, indicates a proper connection.

Figure 2:
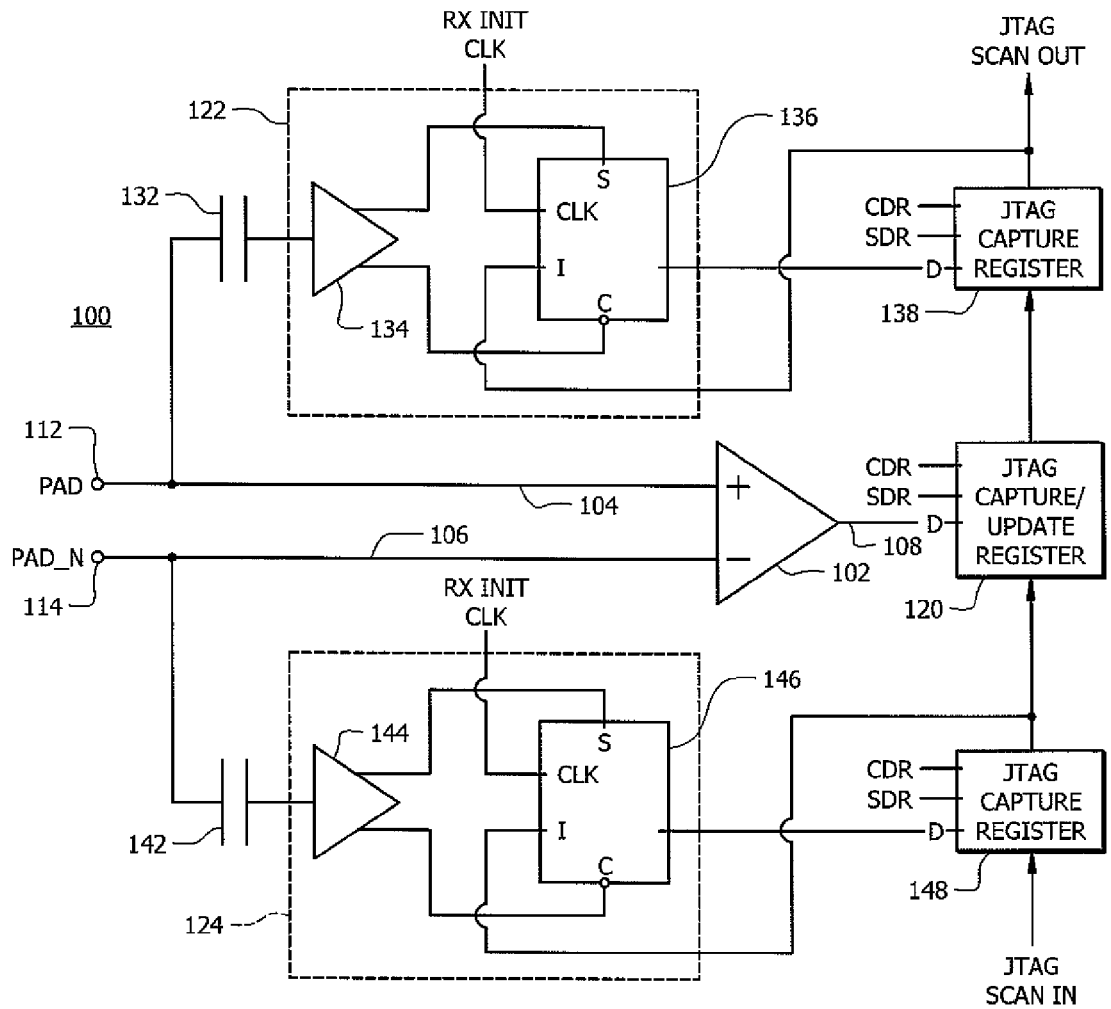
FIG. 2 is a schematic view of a differential receiver including an arrangement for testing proper board connections to the differential receiver according to various representative embodiments of the invention.

Referring now to FIG. 2, shown is a schematic view of a portion of a differential input circuit 100 including a differential receiver arrangement for testing proper board connections to the differential receiver according to various representative embodiments of the invention. The differential input circuit 100 includes a differential receiver 102 having a first positive input 104, a second negative input 106 and an output 108. The first input 104 typically is coupled to a first input/output (I/O) pad 112, and the second input 106 typically is coupled to a second I/O pad 114. The I/O pads 112, 114 are used to couple the differential input circuit 100 to chips, such as a differential driver chip, via a circuit board and circuit board connections, e.g., conductive traces between the differential driver chip and the differential input circuit 100.

The differential receiver 102 is connected to a data storage device, such as a JTAG capture/update register 120. More specifically, the output 108 of the differential receiver 102 is connected to a data (D) input of the JTAG capture/update register 120. The JTAG capture/update register 120 also includes a clock data register input (shown as CDR) and a shift data register input (shown as SDR), which typically receive data shift/capture commands or signal information from control logic (not shown).

According to embodiments of the invention, testing arrangements and methods detect proper DC-coupled board connections on one or both input legs 104, 106 of the differential receiver 102. In general, the testing arrangements and methods involve an AC-coupled, high-pass filter arrangement that provides a more robust and simpler configuration that conventional board connection testing arrangements. The inventive testing arrangements and methods also protect core-level field effect transistor (FET) components (core FETs) within the differential input circuit 100 from relatively large DC voltages, e.g., large voltages coupled to the differential input circuit 100 via the I/O pads 112, 114.

According to embodiments of the invention, the differential input circuit 100 includes a test receiver coupled to the I/O pad of interest. For example, the differential input circuit 100 can include a first test receiver 122 AC-coupled to the first I/O pad 112. The differential input circuit 100 also can include a second test receiver 124 AC-coupled to the second I/O pad 114. More specifically, the first test receiver 122, which is AC-coupled to the first I/O pad 112 via a first capacitor 132, includes a first single ended receiver 134. The first test receiver 122 is capable of being initialized, and holding the initial value until a stimulus is applied that can override the initial value. Because AC-coupled signals are capable of detecting only voltage transitions as opposed to DC levels, the test receiver 122 is configured to identify a high or low transition and storing it until the next transition is detected, effectively reproducing the DC signal on the I/O pad 112. Many different analog designs are capable of this behavior, but for illustrative purposes, a simplified model is shown and described for this analog behavior, with the storage node being an asynchronous SET/CLEAR register 136. The SET/CLEAR register 136 can be initialized to a known digital value of either 0 or 1 via a clock transition. In this configuration, the receiver 134 must be capable of generating both a SET and CLEAR signal, when appropriate, to SET/CLEAR the register 136.

The first single ended receiver 134 and the first data storage register 136 are connected to a first JTAG capture register 138. More specifically, the output of the JTAG capture register 138 is connected to the initialize (I) input of the first data storage register 136. Also, the output of the first data storage register 136 is connected to a data (D) input of the first JTAG capture register 138. The first JTAG capture register 138 also includes a clock data register (CDR) input and a shift data register (SDR) input, which typically receive the same data shift/capture commands or information (from control logic) as the CDR and SDR inputs, respectively, of the JTAG capture/update register 120. The first JTAG capture register 138, along with one or more other data storage registers, such as the JTAG capture/update register 120, form a boundary scan architecture around the differential receiver 102. As such, the output of the first JTAG capture register 138 is designated as the JTAG scan output (JTAG SCAN OUT).

The second test receiver 124, which is AC-coupled to the second I/O pad 114 via a second capacitor 142, includes a second single ended receiver 144 and an appropriate storage node, such as a asynchronous SET/CLEAR register 146. The second test receiver 124 typically is the same in design and performance to the first test receiver 122.

The second single ended receiver 144 and the second data storage register 146 are connected to a second JTAG capture register 148. More specifically, the input of the second single ended receiver 144 that is connected to the initialize input of the second data storage register 146 also is connected to the output of the second JTAG capture register 148. Also, an output of the second data storage register 146 is connected to a data (D) input of the second JTAG capture register 148. The second JTAG capture register 148 also includes a clock data register (CDR) input and a shift data register (SDR) input, which typically receive the same data shift/capture commands from control logic (not shown) as the CDR and SDR inputs, respectively, of the JTAG capture register 138 and the JTAG capture/update register 120. The second JTAG capture register 148 is part of the boundary scan architecture around the differential receiver 102 with the JTAG capture/update register 120 and the first JTAG capture register 138. Accordingly, the input of the second JTAG capture register 148 is designated as the JTAG scan input (JTAG SCAN IN).

It should be noted that the capacitance values of the first capacitor 132 and the second capacitor 142 are relatively small compared to the capacitance values of the capacitors in the first and second RC filters 34, 38 in the conventional testing circuitry shown in FIG. 1. Accordingly, the relative impact of the specific values of the first and second capacitors 132, 134 in affecting acceptable operating ranges for the first and second test receivers 122, 124 is significantly less than that of the capacitors in the first and second RC filters 34, 38. Therefore, the acceptable range of values for the first and second capacitors 132, 142 is much broader than that of the capacitors in the first and second RC filters 34, 38.

In general, the AC-coupled test receivers 122, 124 can detect whether the signal at their respective I/O pad 112, 114 is floating or connected. For example, if an external DC-coupling capacitor (not shown) is supposed to be implemented on the board but is not properly connected to one of the I/O pads, the corresponding test receiver will detect that there is no incoming stimulus. For example, if the I/O pad 112 is not properly connected (i.e., an open or floating connection), any DC transitions that occur at the I/O pad 112 will not be seen by the first test receiver 122 In doing so, the first test receiver 122 will provide an output to the JTAG capture register 138 that, when considered along with the other data by the boundary scan architecture, will result in an indication that the I/O pad 112 is not properly connected. By comparison, if the I/O pad 112 is properly connected, DC transitions that occur at the I/O pad 112 will be seen by the first test receiver 122 and appropriate output will be provided by the first test receiver 122 to the JTAG capture register 138 so that a resulting indication that the I/O pad 112 is properly connected occurs. In this manner, the differential input circuit 100 is DC compliant.

Also, consider an example in which an I/O pad is supposed to be a resistor-terminated pad, i.e., the I/O pad is tied or connected to ground via a terminating resistor and/or to a supply voltage via another terminating resistor. If either one of the terminating resistors breaks or comes loose, the corresponding test receiver will detect the improper connection, e.g., as just discussed hereinabove. However, the conventional testing circuitry arrangement shown in FIG. 1 likely will not recognize the improper connection because the I/O pad still will be tied to either ground or a supply voltage, and this continued DC coupling will be seen by the conventional testing arrangement as a proper connection, even though the value at the I/O pad is outside of any proper operating range.

It should be understood that the testing arrangement shown in FIG. 2 is a model representation for demonstrating the behavior of the test receivers and the testing arrangements. The actual analog circuit design may be much different, although the behavior of the corresponding analog circuit is the same as is modeled in the testing arrangement shown in FIG. 2.

It will be apparent to those skilled in the art that many changes and substitutions can be made to the differential receiver testing arrangements and methods herein described without departing from the spirit and scope of the invention as defined by the appended claims and their full scope of equivalents.

The invention claimed is:

1. A device for testing the connections to a differential receiver, wherein the differential receiver includes a first positive input connected to a first input/output pad, a second negative input connected to a second input/output pad, and an output, comprising:
   at least one test receiver coupled to a corresponding one of the first input/output pad and the second input/output pad, wherein the test receiver includes a single-ended comparator with an output coupled to an input of a data storage register, and wherein the test receiver includes an output coupled to a JTAG capture register, wherein at least one capture/update register is coupled to the output of the differential receiver, and wherein the JTAG capture register is coupled to the capture/update register; and
   a capacitor coupled in series between the input/output pad and the input to the test receiver in a manner that protects the input of the test receiver from DC voltages coupled to the differential receiver via the input of the differential receiver, and
   wherein the at least one test receiver includes a high-pass filter arrangement that generates data of a first type if the input/output pad coupled to the test receiver has a proper DC-coupled connection and data of a second type if the input/output pad coupled to the test receiver has an improper connection.

2. The device as recited in claim 1, wherein, if the input/output pad has a DC voltage coupled thereto, the test receiver is configured to generate the first type of data if the DC voltage is within a first voltage level operating range for the differential receiver and configured to generate the second type of data if the DC voltage is not within the first voltage level operating range for the differential receiver.

3. The device as recited in claim 1, wherein the test receiver is configured to generate the second type of data if the corresponding input/output pad has an open connection.

4. The device as recited in claim 1, wherein the differential receiver is part of a boundary scan architecture.

5. A differential input circuit, comprising:
   a differential receiver having a first positive input, a second negative input and an output;
   a first input/output pad coupled to the first positive input;
   a second input/output pad coupled to the second negative input;
   a first test receiver having a first test receiver input;
   a second test receiver having a second test receiver input;
   a first capacitor coupled in series between the first input/output pad and the first test receiver input, wherein the first test receiver is AC-coupled to the first input/output pad in a manner that protects the first test receiver input from DC voltages coupled thereto; and
   a second capacitor coupled in series between the second input/output pad and the second test receiver input, wherein the second test receiver is AC-coupled to the second input/output pad in a manner that protects the second test receiver input from DC voltages coupled thereto,
   wherein the first and second test receivers each include a single-ended comparator with an input coupled in series to the corresponding capacitor and a data storage register with an input coupled in series to the output of the single-ended comparator, and wherein the first and second test receivers each include an output coupled to a JTAG capture register, wherein at least one JTAG capture/update register is coupled to the output of the differential receiver, and wherein the JTAG capture registers are coupled to the JTAG capture/update register, and
   wherein each of the first and second test receivers includes a high-pass filter arrangement that generates data of a first type if the input/output pad coupled thereto has a proper DC-coupled connection and data of a second type if the input/output pad coupled thereto has an improper connection.

6. The differential input circuit as recited in claim 5, wherein at least one of the first and second test receivers is configured to determine if a DC voltage coupled to the corresponding input/output pad has a voltage level that is within a proper voltage level operating range for the differential input circuit.

7. The differential input circuit as recited in claim 5, wherein, if at least one of the input/output pads has a DC voltage coupled thereto, the corresponding test receiver coupled thereto is configured to generate the first type of data if the DC voltage is within a first voltage level operating range for the differential receiver and configured to generate the second type of data if the DC voltage is not within the first voltage level operating range for the differential receiver.

8. The differential input circuit as recited in claim 5, wherein the at least one test receiver is configured to generate the second type of data if the corresponding input/output pad has an open connection.

9. The differential input circuit as recited in claim 5, wherein at least one of the first and second test receivers is configured to determine if the corresponding input/output pad connected thereto has an open connection or is DC coupled.

10. The differential input circuit as recited in claim 5, wherein the differential input circuit is part of a boundary scan testing circuitry arrangement.

11. The differential input circuit as recited in claim 5, wherein the first test receiver includes an input coupled between the first input/output pad and the first positive input, and wherein the second test receiver includes an input coupled between the second input/output pad and the second negative input, and wherein the JTAG capture registers and the JTAG capture/update register are part of a boundary scan architecture.

* * * * *